United States Patent
Altekrüger et al.

(10) Patent No.: US 6,203,610 B1
(45) Date of Patent: Mar. 20, 2001

(54) DEVICE AND A PROCESS FOR MONITORING A MELT FOR THE PRODUCTION OF CRYSTALS

(75) Inventors: Burkhard Altekrüger; Joachim Aufreiter, both of Alzenau; Dieter Brüss, Bruchköbel; Klaus Kalkowski, Gründau, all of (DE)

(73) Assignee: Leybold Systems GmbH, Hanau (DE)

( * ) Notice: Subject to any disclaimer, the term of this patent is extended or adjusted under 35 U.S.C. 154(b) by 0 days.

(21) Appl. No.: 09/297,441

(22) PCT Filed: Sep. 2, 1998

(86) PCT No.: PCT/EP98/05565
§ 371 Date: May 17, 1999
§ 102(e) Date: May 17, 1999

(87) PCT Pub. No.: WO99/11844
PCT Pub. Date: Mar. 11, 1999

(30) Foreign Application Priority Data

Sep. 3, 1997 (DE) .............................. 197 38 438
Apr. 21, 1998 (DE) .............................. 198 17 709

(51) Int. Cl.[7] .................................. C30B 15/20
(52) U.S. Cl. .............................. 117/14; 117/15; 117/201; 117/202; 117/900
(58) Field of Search .............................. 117/14, 15, 201, 117/202, 900

(56) References Cited

U.S. PATENT DOCUMENTS

| | | | |
|---|---|---|---|
| 5,665,159 | * | 9/1997 | Fuerhoff .............................. 117/201 |
| 5,843,479 | * | 12/1998 | Aufreiter et al. . |
| 5,846,318 | * | 12/1998 | Javidi .............................. 117/14 |
| 5,935,322 | * | 8/1999 | Shimomura et al. .............................. 117/14 |
| 5,961,716 | * | 10/1999 | White et al. .............................. 117/14 |
| 6,030,451 | * | 2/2000 | LaBrie et al. .............................. 117/14 |

FOREIGN PATENT DOCUMENTS

| | | |
|---|---|---|
| 273 459A1 | 11/1989 | (DE) . |
| 19738438 | 3/1999 | (DE) . |
| 0536405 | 4/1993 | (EP) . |
| 0588355 | 3/1994 | (EP) . |
| 0745830 | 12/1996 | (EP) . |

OTHER PUBLICATIONS

Patent Abstracts of Japan 08259381 filed Aug. 10, 1996, vol. 97, No. 2, Feb. 28, 1997.

Journal of Crystal Growth, 13/14 (1972), pp. 624–628, O'Kane et al, "Infrared TV System of Computer Czochralski Crystal Growth".

Journal of Crystal Growth, 116 (1992), Jan., Nos. ½, Wargo et al., "Real Time Thermal Imaging for Analysis and Control Growth by The Czochralski Technique".

* cited by examiner

Primary Examiner—Felisa Hiteshew
(74) Attorney, Agent, or Firm—Smith, Gambrell & Russell, LLP

(57) ABSTRACT

A device for monitoring a melt for the production of crystals. A camera is provided which images at least portions of the surface of the contents of a crucible. An evaluating device is used to evaluate the camera's images with respect to solid and liquid portions of the surface of the crucible contents.

19 Claims, 3 Drawing Sheets

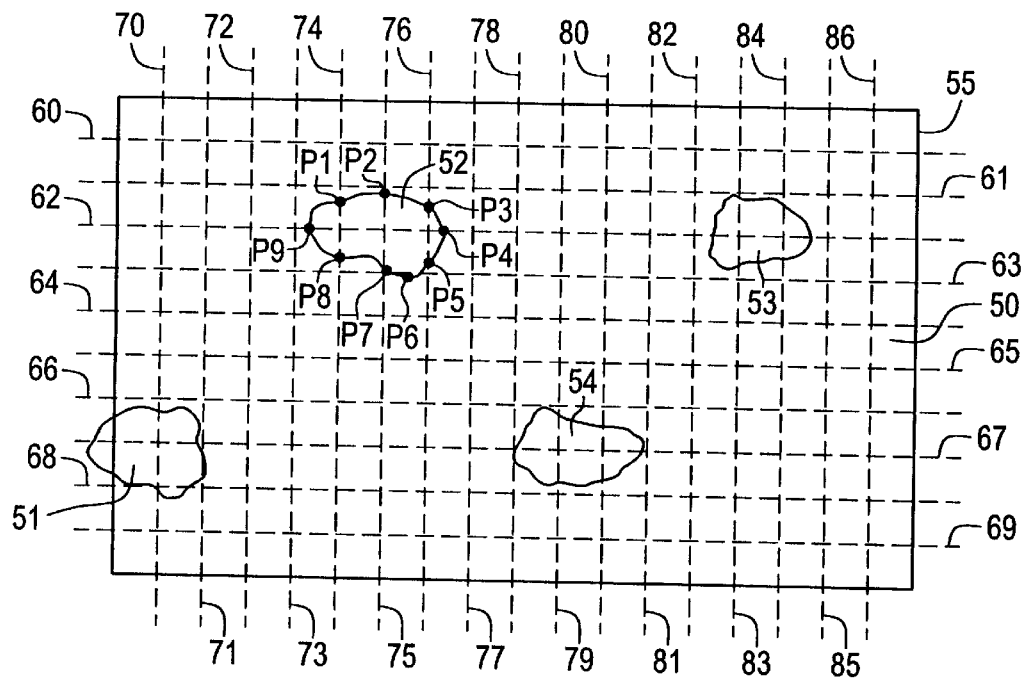
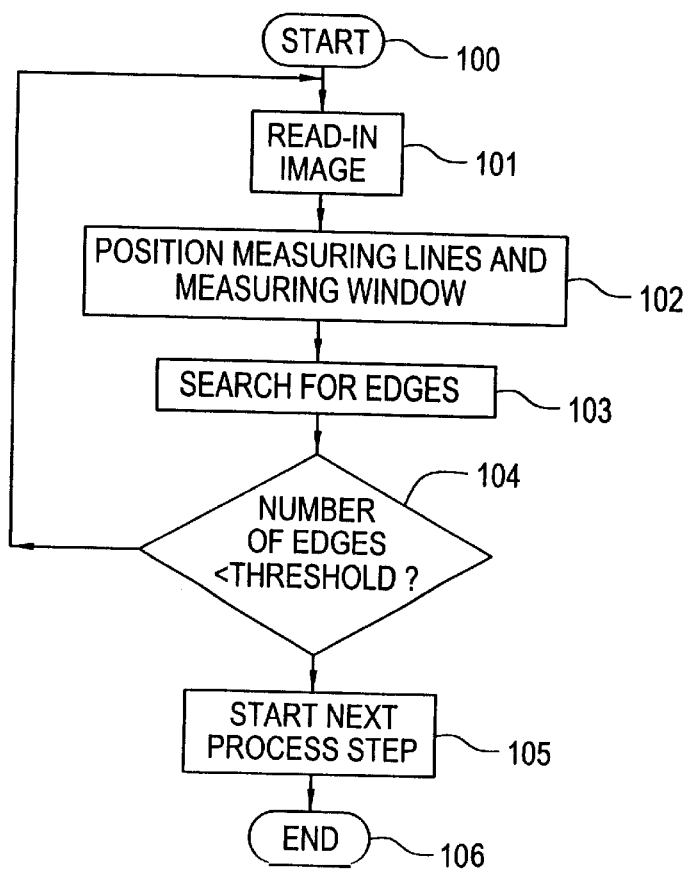

DEVICE AND A PROCESS FOR MONITORING A MELT FOR THE PRODUCTION OF CRYSTALS

INTRODUCTION AND BACKGROUND

The invention relates to a device for monitoring a melt for the production of crystals and a process therefor.

When a given material, for example, Si polymaterial is thoroughly melted in a quartz crucible, the transition from a solid to a liquid state does not, as a rule, occur abruptly, but rather, gradually. In the actual practice of creating crystals it is very important that the given melt state be precisely known or identifiable, since this state dictates the procedural steps that are to follow.

There are experienced melt specialists who are able to precisely infer the state of the melt from the surface appearance of a crucible. Also known is the automatic identification of a melt state using pyrometers as sensors, though this results in an unreliable kind of regulation involving long time constants.

Various processes have already been suggested for an improved automatic regulation of the drawing process of a monocrystal. For example, a process for drawing a monocrystal from the melt is known in which the individual crystals are drawn up while the data influencing the drawing process, which are based on numerous conditions, are recorded and compared with other data (EP 0 536 405 A1). In the process, a laser beam, for example, strikes the surface of molten material located in a crucible. Identification of a reflected laser beam allows the position of the molten surface to be determined, and the crucible is elevated according to the difference between the measured position and a predetermined position. However, this known process does not permit reliable process monitoring during the melting phase.

Also known is an optical system or process for regulating the growth of a silicon crystal in which the diameter of a silicon crystal drawn from a melt is measured with the assistance of a television camera; here the surface of the melt exhibits a meniscus which is visible as a bright area in close proximity to the silicon crystal (EP 0 745 830 A2). In this system, a camera is used to produce an image pattern of a portion of the bright area near the silicon crystal. The characteristics of the image pattern are then detected. A characteristic of the visual pattern would be, for example, the light intensity gradient. After this, one edge of the bright area is defined as a function of the detected characteristics. Then an outline is defined which closes the defined edge of the bright area; finally the diameter of the defined outline is determined, and the diameter of the silicon crystal is determined as a function of that defined outline diameter. A disadvantage of this known system is that its accuracy is insufficient in several applications and external influences, in particular, are not adequately taken into account.

To eliminate these disadvantages it has already been suggested to add to the camera imaging the first area of the crystal a second camera which images a second portion of the crystal; the diameter of the crystal is determined in an evaluation circuit using the images of both cameras (unpublished patent application 197 38 438.2). In this manner it is possible to precisely record the actual crystal diameter in all phases of the cultivation process. The melting process itself cannot be monitored with the proposed device.

An object of the invention is to overcome the problem of monitoring the melting process for the basic materials from which monocrystals are drawn.

SUMMARY OF THE INVENTION

The above and other objects of the invention can be achieved with a device for monitoring a melt for the production of crystals, wherein a camera is provided which images at least portions of the surface of the contents of a crucible and with an evaluating device provided which evaluates the camera's images with respect to solid and liquid portions of the surface of the crucible contents.

A feature of the invention resides in a process for monitoring a melt serving the production of crystals, wherein:

a) at least portions of the surface of the contents of the crucible are imaged with a camera; and, b) the image made by the camera is evaluated with respect to solid and liquid components on the surface of the contents of the crucible.

The advantage achieved with the invention particularly consists in shortening the process time, avoiding overheating of the melt and the crucible, and minimizing the $O_2$ content of the melt. The use of a special sensor thus makes it possible to implement a melt control before complete fusion of the molten material. In addition, individual differences can be identified per batch and taken into account.

BRIEF DESCRIPTION OF DRAWINGS

An example of embodiment of the invention is shown in the drawings and is described below in greater detail. Shown are:

FIG. 3 is an enlarged depiction of the measuring window of a camera directed at the surface of a crucible; and FIG. 4 is a flow chart for the process of identifying solid or liquid components of the melt.

DETAILED DESCRIPTION OF INVENTION

Figure 1:
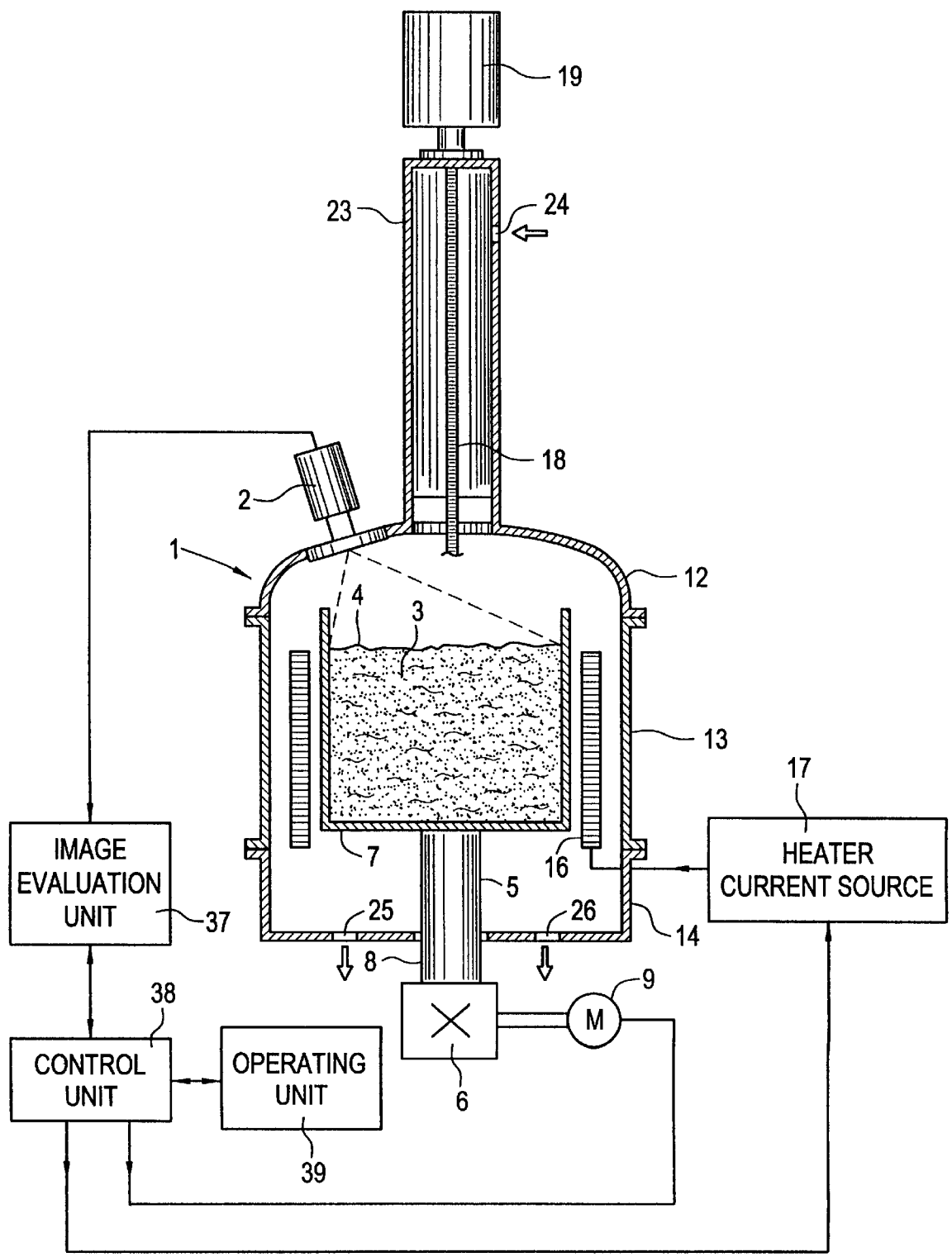
FIG. 1 is a general depiction of the device according to the invention.

FIG. 1 shows a device which makes it possible to identify the fusion of molten material at an early stage. This device is based on an optical principle according to which those areas of a melt that are liquid emit less visible light than areas that are still solid or that have solidified out of the melt. Instead of, or in addition to, this brightness principle, the principle of hue or chrome and/or color saturation can be used—inasmuch as molten materials differ from non-molten materials not only in brightness but also in chrome and/or color saturation.

To identify the brightness of the melt, a camera 2 is provided; the camera can be a CCD video camera. This camera 2 is positioned diagonally over the crucible 7 in which the melt 3 is located. The camera 2 is used to observe the surface 4 of the melt 3, or at least a portion of this surface 4.

The crucible 7 can be moved by means of a shaft 5 and a gear 6 using a motor 9, for example, from above downwards. It is also possible to make it rotate. The crucible 7 is located in a housing consisting of an upper part 12, a middle part 13, and a lower part 14. The lower part 14 is furnished with two gas outlets 25, 26. An electrical heating system 16 is positioned around the crucible 7 and is provided with electrical energy from a heater current source 17. Parts that are not depicted can brought into the proximity of the melt 3 with a threaded rod 18 driven by a motor 19. The threaded rod 18 is enclosed in a cylindrical unit or pipe 23 belonging to the upper part 12, which is provided with a gas inlet opening 24.

The output signals of camera 2 are fed to an image evaluating unit 37, which exchanges data with a control unit 38. This control unit 38 can be influenced by means of an operating unit 39, for example, a keyboard. The control unit 38 makes it possible to control the drive 6, 9 for the crucible 7 and to control the heater current source 17.

Figure 2A:
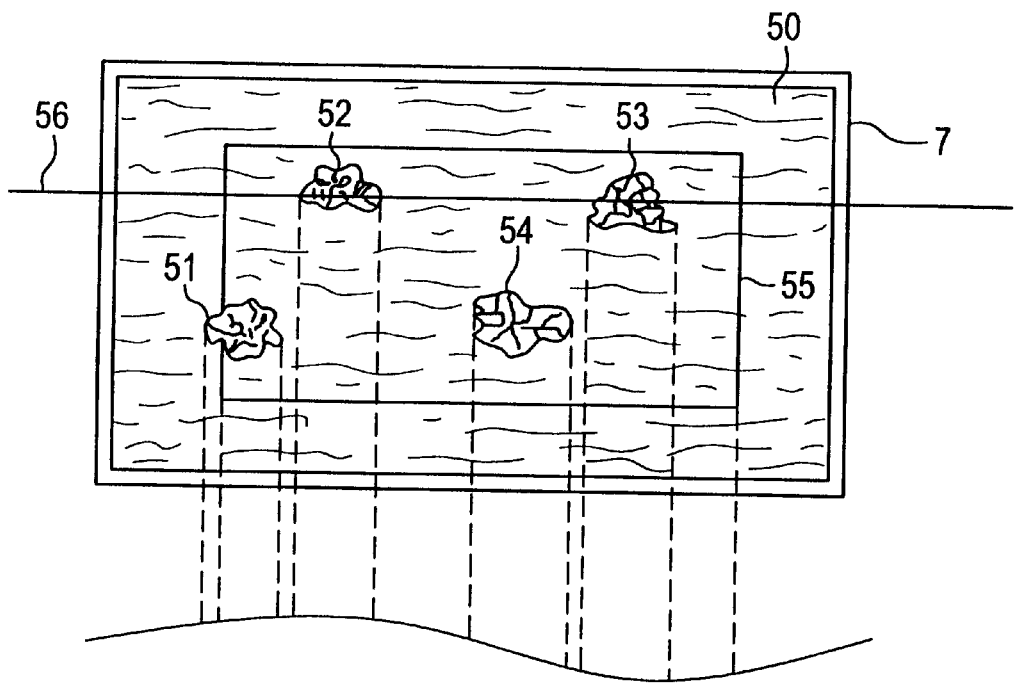
FIG. 2a is a top view of a crucible containing molten material.

FIG. 2a depicts the crucible 7 in a view from above. Located in the crucible 7 is liquid material 50, e.g., liquid silicon, in which there are several islands 51 to 54 of hardened material. The liquid melt 50 emits less brightness than the hardened islands 51–54, because the hardened material better reflects visible light than the liquid material. As a result, the islands 51–54 have a brighter appearance than the surrounding liquid material 50.

Reference numeral 55 designates a measuring window which corresponds to the viewing angle of the camera 2, i.e., the camera 2 records the area of the crucible 7 defined by the measuring window 55. Reference numeral 56 designates a measuring line whose meaning will be explained below.

Figure 2B:
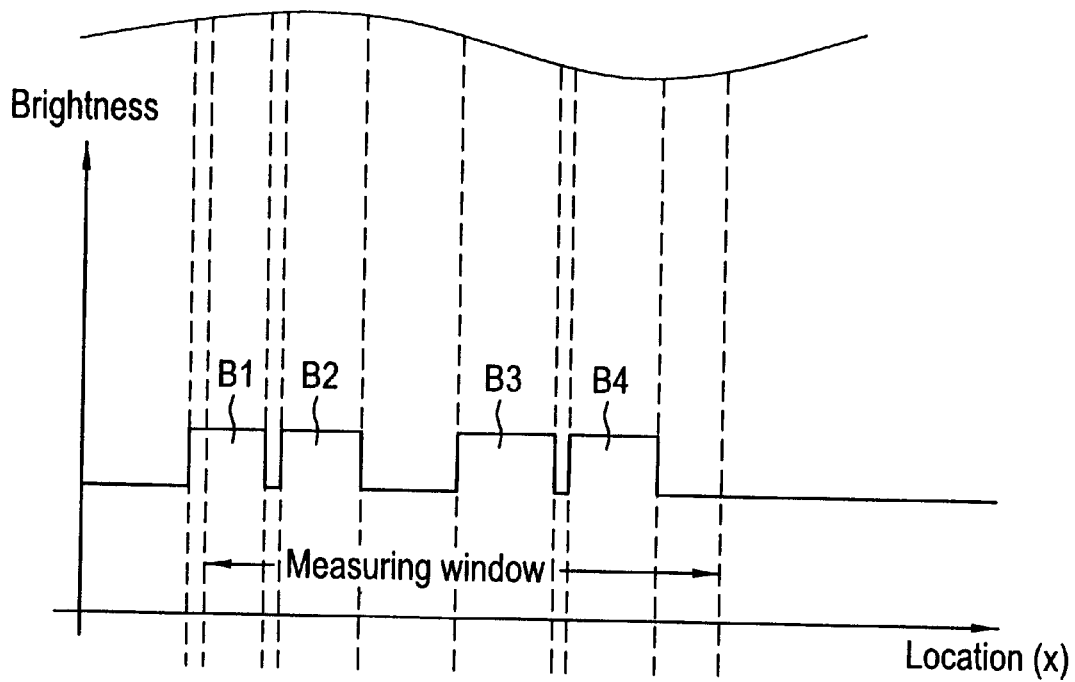
FIG. 2b is a graphic depiction of the brightness distribution along a horizontal line on the crucible.

In FIG. 2b the brightness of the crucible contents is depicted in an x coordinate system. It will be seen that those points where solid islands 51–54 are located exhibit a greater brightness $B_1 \ldots B_4$ than at those points where the liquid melt is located.

If only the islands 52, 53 through which measuring line 56 passes are taken into account, then brightnesses $B_1$ and $B_3$ in FIG. 2b would fall out.

FIG. 3 again shows the measuring window 55 with the melt 50 and the islands 51 to 54 located therein, but on an enlarged scale. Superimposed on the measuring window are a number of horizontal and vertical measuring lines 60 to 69 and 70 to 86, so as to form a lattice. These measuring lines 60 to 69 and 70 to 86 are scanning lines and columns for the CCD camera 2. The measuring window recorded by the CCD camera 2 is thus scanned line by line or column by column, i.e., the scanning lines and columns shown in FIG. 3 are approached in time-multiplex fashion.

With this kind of scanning, the brightness transitions between solid and liquid Si are recorded; this is marked by points $P_1 \ldots P_9$ with reference to island 52. By identifying these brightness transitions, it is possible to precisely establish the aggregate state of the surface of the Si melt.

If the individual points $P_1 \ldots P_9$ are known, the surface area of the island 52 can be calculated. The surface areas of the other islands 51, 53, 54 can be calculated in corresponding fashion. This in turn creates the possibility of determining the ratio of liquid surface to solid surface. Different values can be established for these ratios, which, when reached, will result in the execution of certain procedural steps. Of particular interest here is the disappearance of the solid surface portion of the melt, since this state indicates a finished melt. Since the disappearance of solid bodies can be simulated by natural events, a predetermined waiting period is observed during which the crucible continues to rotate. Only after this waiting period is over is it assumed that the solid parts of the surface have actually disappeared; the appropriate procedural step is then initiated.

FIG. 4 shows the process flow of the invention in the form of a flow chart. After the startup indicated by block 100, the surface of the melt reproduced by the CCD camera 2 is read as an image in digital form into a storage unit (not shown), as suggested by block 101. The image thus read in is now scanned line by line and/or column by column, cf. block 102, and monitored for brightness. Whenever the difference in brightness between adjacent points of a line and/or column exceeds a predetermined threshold value, the local coordinate of the transition point—the so-called edge—is identified and stored, cf. block 103.

In this manner it is possible to locate, e.g., points $P_1 \ldots P_9$ of island 52. With a suitable interpolative process a path can be drawn joining these points $P_1 \ldots P_9$, giving the outline of island 52. From this the surface area of the island 52 can be calculated.

If the islands 51 to 54 become larger or increase in number, the number of identified edges also increases. The number of identified edges is thus a measure of the molten state on the surface of the melt. If a specific melt value is established for the number of edges—cf. block 104—a predetermined melt-solid body behavior can be defined, arrival at which will trigger a given process step. This is indicated by block 105. A process step of this kind might be, for example, a reduction in the heat in heating element 16 or an increase in the crucible's rate of revolution. When all process steps have been executed, the process can be terminated.

The threshold value for the number of edges could be input via, e.g., the operating unit 39.

The invention thus makes it possible to monitor and influence the individual steps in the production of a crystal, even at an early point in the process. If solid semiconductor lumps, for example, are left hanging on the wall of the crucible or if lumps drifting in the melt threaten to touch equipment above the melt, and to damage it, the heating output, for example, and/or the rate of rotation of the crucible can be modified appropriately in order to accelerate the melting process.

If the process according to the invention establishes that the solid/liquid ratio=0, a waiting period of 1 to 5 minutes is introduced, until the next process step is introduced, since, as mentioned above, disruptive influences can simulate a complete liquefaction of the melt when some unmolten parts still remain in it. This waiting period assures that all material has actually melted and that the process of drawing a crystal can begin. The length of the waiting period depends on the crucible's rate of rotation. If the crucible is rotated quickly, the waiting period can be shortened, since the increased rate of rotation will more rapidly bring the unmelted lumps into the area where they are melted.

Further variations and modifications of the foregoing will be apparent to those skilled in the art and are intended to be encompassed by the claims appended hereto.

German priority applications 197 38 438.2 and 198 17 709.7 are relied on and incorporated herein by reference.

We claim:

1. A device for monitoring the surface of the contents of a crucible, comprising a camera which images at least portions of said surface wherein said surface comprises solid and liquid portions having different optical properties and an evaluation device which evaluates the camera's image with respect to solid and liquid portions of the surface of the crucible contents.

2. A device according to claim 1, wherein the crucible is rotatable around an axis.

3. A device according to claim 1, wherein the crucible is surrounded by a heating device.

4. A device according to claim 1, wherein the camera is a video camera.

5. A device according to claim 1, wherein the content of the crucible consists of semiconductor material.

6. A device according to claim 1, wherein the axis of the camera relative to the axis of the crucible exhibits an angle α of 0<α<90°.

7. A device according to claim 6, wherein the image made by camera is corrected in the amount of the imaging error arising with angle α.

8. A method for monitoring the melting process in a crucible by observing the surface of the contents of the crucible by means of a video camera, said method comprising the following steps:
   a) imaging at least portions of the surface of the contents of said crucible by said camera;
   b) scanning points of the imaged portion line by line and/or column by column and recording the brightness of scanned points;
   c) comparing the brightness of adjacent points on a line and/or a column;
   d) storing coordinates of brightness transitions when a predetermine difference in brightness between two adjacent points is identified;
   e) determining liquid and solid areas in the surface of the contents of the crucible by coating the numbers of adjacent points with predetermined difference in brightness; and
   f) initiating a process step when a predetermined relationship between solid and liquid portions has been recognized.

9. Method according to claim 8 wherein the portions imaged by the camera are stored in an information storage prior to the scanning of points.

10. Method according to claim 8 comprising the steps:
    a) determining the points of each solid island of said surface, said points representing differences in contrast;
    b) calculating the area of each solid island determined by said points; and
    c) calculating the ratio of said solid islands to unmelted material of the surface of the contents of said crucible.

11. A process according to claim 8, wherein said initiating is a change in the rate of revolution of the crucible.

12. A process according to claim 8, wherein said initiating is the regulation of the gas flow or gas pressure.

13. The process according to claim 8, wherein the ratio of melted to unmelted material is ascertained and certain ratios are correlated with certain process steps.

14. The process according to claim 13, wherein cessation of signals for unmelted material will introduce a step involving drawing of crystals.

15. The process according to claim 8, wherein said process is interrupted for a given period of time when a portion of solid materials has reached zero, to thereby assure that the identified zero value was not caused accidentally.

16. The process according to claim 15, wherein the given period of time, is from 1 to 5 minutes.

17. A method for monitoring the melting process in a crucible by observing the surface of the contents of the crucible by means of a video camera, said method comprising the following steps:
    a) imaging at least portions of the surface of the contents of said crucible by said camera;
    b) scanning points of the imaged portion line by line and/or column by column and recording the chrominance of scanned points;
    c) comparing the chrominance of adjacent points on a line and/or a column;
    d) storing coordinates of brightness transitions when a predetermine difference in chrominance between two adjacent points is identified;
    e) determining liquid and solid areas on the surface of the contents of the crucible by counting the number of adjacent points with predetermined difference in chrominance; and
    f) initiating a process step when a predetermined relationship between solid and liquid portions has been recognized.

18. Method according to claim 17 wherein the portions imaged by the camera are stored in an information storage prior to the scanning of points.

19. Method according to claim 17 comprising the steps:
    a) determining the points of each solid island of said surface, said points representing differences in contrast;
    b) calculating the area of each solid island determined by said points; and
    c) calculating the ratio of said solid islands to unmelted material of the surface of the contents of said crucible.

* * * * *